US012564008B2

(12) United States Patent
Wong et al.

(10) Patent No.: US 12,564,008 B2
(45) Date of Patent: Feb. 24, 2026

(54) METHOD AND TREATMENT SYSTEM FOR UNIFORM PROCESSING OF SEMICONDUCTOR DEVICES

(71) Applicant: Taiwan Semiconductor Manufacturing Co., Ltd., Hsinchu (TW)

(72) Inventors: Cheng-Shiuan Wong, Hsinchu (TW); Chao-Wei Chiu, Hsinchu (TW); Wei-Yu Chen, Taipei (TW); Chih-Chiang Tsao, Taoyuan (TW); Hao-Jan Pei, Hsinchu (TW); Hsiu-Jen Lin, Zhubei (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 457 days.

(21) Appl. No.: 18/152,340

(22) Filed: Jan. 10, 2023

(65) Prior Publication Data

US 2024/0234192 A1     Jul. 11, 2024

(51) Int. Cl.
*H01L 21/683*       (2006.01)

(52) U.S. Cl.
CPC ...... *H01L 21/6836* (2013.01); *H01L 21/6835* (2013.01)

(58) Field of Classification Search
CPC ............. H01L 21/6836; H01L 21/6835; H01L 21/02115; H01L 21/02274; H01L 2221/68327; H01L 2221/68381; H01L 2221/68318; H01L 2221/6834; H01L 21/78; B32B 43/006; B32B 2457/14; C23C 16/26
USPC ........................................................ 438/113
See application file for complete search history.

(56) References Cited

U.S. PATENT DOCUMENTS

| | | | | |
|---|---|---|---|---|
| 8,402,918 | B2 * | 3/2013 | Kadkhodayan ..... | H01J 37/3244 |
| | | | | 156/345.46 |
| 9,353,440 | B2 * | 5/2016 | Ge ................... | C23C 16/45578 |
| 9,761,493 | B2 * | 9/2017 | Celler ................ | H01L 21/7813 |
| 9,892,908 | B2 * | 2/2018 | Pettinger .......... | H01J 37/32449 |
| 10,100,408 | B2 * | 10/2018 | Ha .................... | H01J 37/32091 |
| 10,167,553 | B2 * | 1/2019 | Rasheed ........... | C23C 16/45502 |
| 10,504,754 | B2 * | 12/2019 | Tan ................... | H01L 21/6719 |
| 10,526,703 | B2 * | 1/2020 | Huang ............. | H01L 21/02107 |
| 11,015,247 | B2 * | 5/2021 | Batzer .............. | C23C 16/45565 |
| 11,066,747 | B2 * | 7/2021 | Liang ............... | C23C 16/4405 |
| 11,139,791 | B2 * | 10/2021 | Parthasarathy .......... | H03F 3/19 |
| 11,420,217 | B2 * | 8/2022 | Mustafa ........... | C23C 16/45553 |
| 11,859,284 | B2 * | 1/2024 | Chen ................. | H01J 37/3244 |
| D1,037,778 | S * | 8/2024 | Agarwal ........................ | D7/323 |

(Continued)

*Primary Examiner* — Vu A Vu

(74) *Attorney, Agent, or Firm* — Slater Matsil, LLP

(57) ABSTRACT

A method includes attaching a carrier to a semiconductor wafer using a release film; removing the carrier from the semiconductor wafer; and performing a treatment process to remove the release film from the semiconductor wafer, the treatment process comprising: flowing an etchant through a diffusion plate within a treatment chamber, the diffusion plate comprising concentric rings separated by dividers, the concentric rings comprising a first concentric ring of holes, a second concentric ring of holes, and a third concentric ring of holes, each of the concentric rings having a different hole density; and performing a cleaning process on the semiconductor wafer.

20 Claims, 14 Drawing Sheets

(56)                     References Cited

U.S. PATENT DOCUMENTS

| | | | |
|---|---|---|---|
| 2021/0079526 A1* | 3/2021 | Iizuka | ................... C23C 16/402 |
| 2023/0282450 A1* | 9/2023 | Pape | ...................... C23C 16/30 |
| | | | 156/345.34 |

* cited by examiner

161

163

167C

167B

167A

175

169A

169B

169D

METHOD AND TREATMENT SYSTEM FOR UNIFORM PROCESSING OF SEMICONDUCTOR DEVICES

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
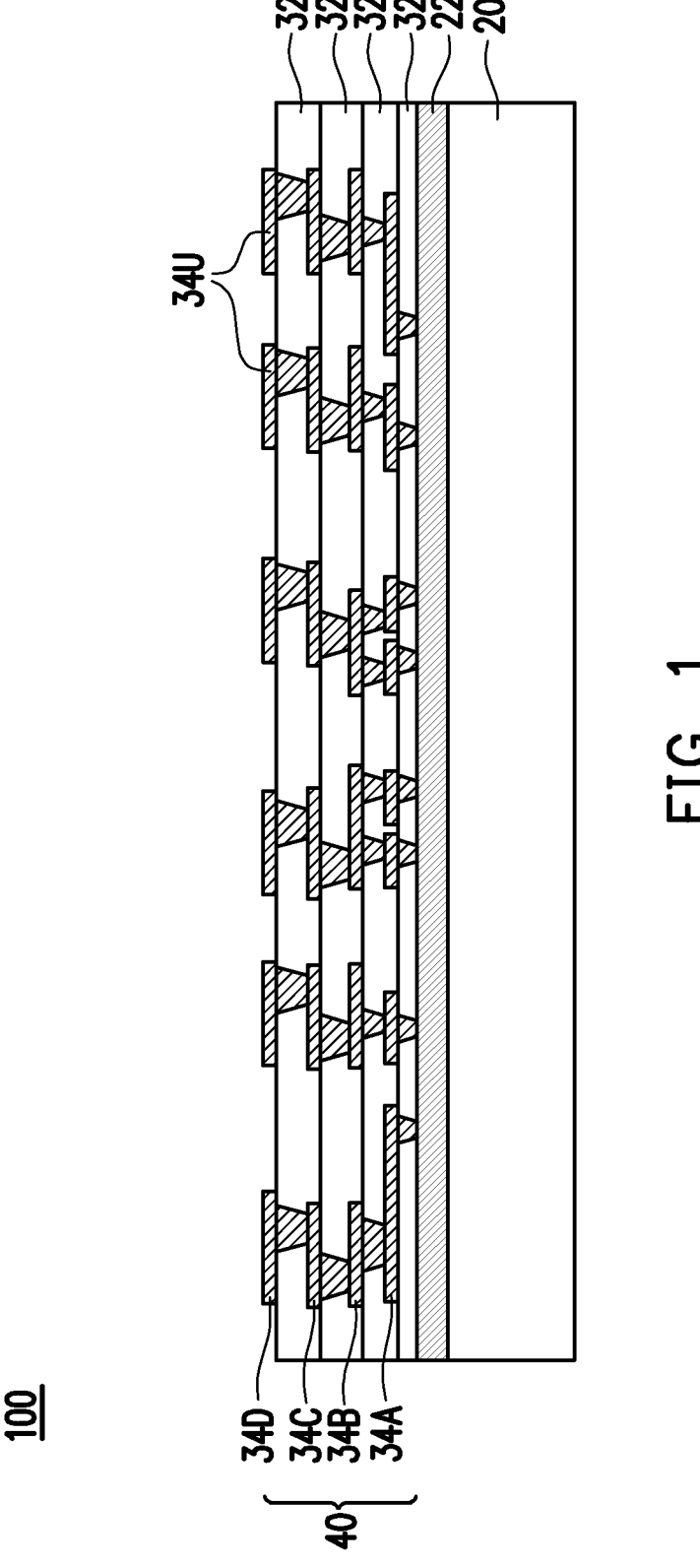
FIGS. 1, 2, 3, 4, 5, 6A, and 6B illustrate cross-sectional views of intermediate stages in the formation of a semiconductor package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a semiconductor package at a wafer level, such as a chip on wafer on substrate (CoWoS®) device. At one or more stages of formation, etch processes may be performed to remove layers (e.g., a release film removed after de-bonding a carrier) with uniformity across an entirety of the wafer. In particular, the etch processes may utilize a treatment system (e.g., a plasma treatment system) which includes a showerhead within the treatment chamber having a diffusion plate with particular hole arrangements. For example, varying hole densities and including blocking dividers in the diffusion plate based on distances from the center ensures that precursor material (e.g., treatment plasma) passes through the diffusion plate and reaches the entirety of the wafer at substantially the same rate and/or flux. As a result, the semiconductor package may be formed with improved efficiency and with higher yield.

FIGS. 1 through 6B and 8A through 9 illustrate intermediate stages in the formation of a semiconductor package, in accordance with some embodiments. FIG. 1 illustrates the formation of redistribution structure 40 on carrier 20. For example, before forming the redistribution structure 40, release film 22 may be formed on carrier 20. The carrier 20 may be a glass carrier, a silicon wafer, an organic carrier, or the like. The carrier 20 may have a round top-view shape in accordance with some embodiments. The release film 22 may be a die-attachment film (DAF), such as being formed of a polymer-based material (e.g., a polyimide) and/or an epoxy-based thermal-release material (such as a Light-To-Heat-Conversion (LTHC) material), which is capable of being decomposed under radiation such as a laser beam, so that the carrier 20 may be de-bonded from the overlying structures that will be formed in subsequent processes. In accordance with some embodiments, the release film 22 is applied on the carrier 20 through coating.

As illustrated, the redistribution structure 40, which includes a plurality of dielectric layers 32 and a plurality of redistribution lines (RDLs) 34, is formed over the release film 22. In accordance with some embodiments, a first dielectric layer 32A is formed on the release film 22. The dielectric layer 32A is formed of or comprises an organic material, which may be a polymer. The organic material may also be a photo-sensitive material. For example, the dielectric layer 32A may be formed of or comprises polyimide, PBO, BCB, or the like. The dielectric layer 32A may be formed using a process such as lamination, coating, (e.g., spin-coating), chemical vapor deposition (CVD), or the like.

A first plurality of RDLs 34 (denoted as 34A) are formed on dielectric layer 32A. The formation of RDLs 34A may include patterning dielectric layer 32A to form via openings, forming a metal seed layer (not shown) over dielectric layer 32A and extending into the via openings, forming a patterned plating mask (not shown) such as a photoresist over the metal seed layer, and then performing a metal plating process to deposit a metallic material (e.g., copper, or the like) on the exposed metal seed layer. The patterned plating mask and the portions of the metal seed layer covered by the patterned plating mask are then removed, leaving RDLs 34A as shown. In accordance with some embodiments, the metal seed layer includes a titanium layer and a copper layer over the titanium layer. The metal seed layer may be formed using, for example, PVD or a like process. The plating process may be performed using, for example, an electro-chemical plating process or an electro-less plating process.

FIG. 1 further illustrates additional dielectric layer(s) 32B, 32C, and 32D and additional RDLs 34B, 34C, and 34D, for example. Throughout the description, dielectric layers 32A, 32B, 32C, and 32D are individually and collectively referred to as dielectric layers 32, and RDLs 34A, 34B, 34C, and 34D are individually and collectively referred to as RDLs 34. In accordance with some embodiments, dielectric layer 32B is formed on RDLs 34A. The bottom surface of dielectric layer 32B is in contact with the top surfaces of RDLs 34A and dielectric layer 32A. Dielectric layer 32B may be formed of or comprise an organic dielectric material, which may be a polymer. For example, dielectric layer 32B may comprise a photo-sensitive material such as PBO, polyimide, BCB, or the like. Dielectric layer 32B is then patterned to form via openings (occupied by the via portions of RDLs 34B) therein. Hence, some portions of RDLs 34A are exposed through the openings in dielectric layer 32B.

In addition, RDLs 34B are formed on dielectric layer 32B to connect to RDLs the 34A. The RDLs 34B include via portions (also referred to as vias) extending into the openings in the dielectric layer 32B, and trace portions (metal line portions, or RDL lines) over the dielectric layer 32B. The formation of the RDLs 34B may be similar to the formation of the RDLs 34A. Each of the vias may have a tapered profile, with the upper portions being wider than the corresponding lower portions.

After the formation of the RDLs 34B, the remaining dielectric layers (e.g., dielectric layers 32C and 32D) and the corresponding RDLs (e.g., RDLs 34C and 34D, which may be referred to as upper RDLs) are formed. As illustrated, the upper RDLs are formed over and landing on the respective lower RDLs (e.g., RDLs 34A and 34B). As such, RDLs 34C are formed on dielectric layer 32C and RDLs 34D are formed on dielectric layer 32D to facilitate electrical connection among all levels of the RDLs 34. The materials of the additional dielectric layers may be selected from the same group (or different group) of candidate materials as the dielectric layers 32A and 32B, which candidate materials may include a polymer such as polyimide, PBO, BCB, or the like. The dielectric layers 32 and the RDLs 34 collectively form redistribution structure 40. Note that any sufficient number of dielectric layers 32 and RDLs 34 may be utilized. In some embodiments, an uppermost of the layers (e.g., the dielectric layer 32D) may be a passivation layer being made of a similar or different material. For example, the dielectric layer 32D may have a thickness ranging from 8 μm to 10 μm, such as 9 μm.

In some embodiments (not specifically illustrated), one or more bonded dies may be formed within the redistribution structure 40, such as being attached and electrically coupled to the lower RDLs (e.g., RDLs 34A and 34B) before forming the upper RDLs over and electrically coupled to the lower RDLs (e.g., RDLs 34C and 34D). In some embodiments, conductive vias may be formed to electrically couple the upper RDLs to the lower RDLs, and the bonded dies and the conductive vias may be encapsulated in an encapsulant. The bonded dies may include one or more integrated voltage regulator (IVR) dies and/or one or more of passive device dies, interconnect dies, and or the like. For example, the IVR dies may include voltage regulators for regulating voltage supplies for overlying device dies (see, e.g., FIG. 4). In addition, the passive dies may include an Independent Passive Device (IPD) die including a capacitor therein, an IPD die including a resistor therein, an interconnect die for bridging two of the overlying device dies, the like, or combinations thereof.

In accordance with some embodiments, the dielectric layers 32C and 32D (e.g., upper dielectric layers corresponding to the upper RDLs) may be formed of different materials and have different thicknesses than the dielectric layers 32A and 32B (e.g., lower dielectric layers corresponding to the lower RDLs). For example, each or some of the upper dielectric layers 32C and 32D may be thicker than each or some of the lower dielectric layers 32A and 32B. In accordance with some embodiments, the lower dielectric layers 32A and 32B are formed of a non-photo-sensitive material such as molding compound, molding underfill, silicon oxide, silicon nitride, or the like. The upper dielectric layers 32C and 32D, on the other hand, may be formed of a photo-sensitive material(s) such as PBO, polyimide, or the like. In accordance with alternative embodiments, all of the dielectric layers 32 are formed of photo-sensitive material(s). The dielectric layers 32 may be formed using processes such as lamination, coating, (e.g., spin-coating), chemical vapor deposition (CVD), atomic layer deposition (ALD), or the like.

Similarly, in accordance with some embodiments, the RDLs 34C and 34D (e.g., the upper RDLs) are thicker and/or wider than the RDLs 34A and 34B (e.g., the lower RDLs), and may be used for long-range electrical routing, while the lower RDLs may be used for short-range electrical routing. All of the RDLs 34 may comprise copper, or the like. As further illustrated, some surface conductive features 34U are formed, which may be parts of the RDLs 34D, or may be separately formed Under-Bump Metallurgies (UBMs) and/or bond pads.

Figure 2:
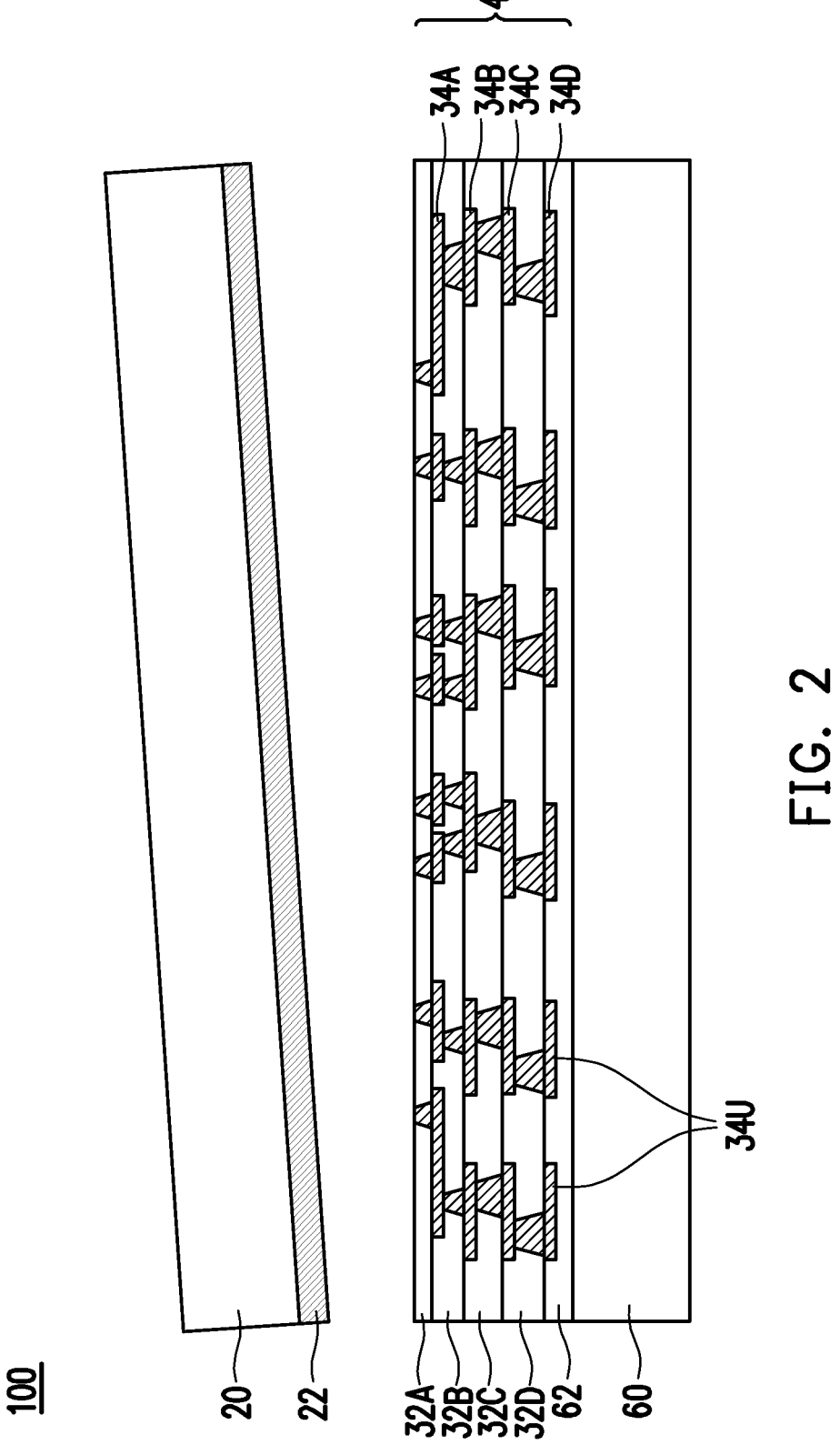

In FIG. 2, a carrier-switch process is performed. In the carrier-switch process, the redistribution structure 40 (e.g., the dielectric layer 32D) is first attached to carrier 60 through release film 62. The carrier 60 is formed of a transparent material, and may be a glass carrier, a ceramic carrier, or the like. The release film 62 may be formed of an LTHC coating material which may be a similar or different material than the release film 22 (e.g., a DAF), such as being a polymer-based material (e.g., a polyimide) or an epoxy-based material. For example, the release film 62 may be formed being free of voids over the uneven topography of the surface conductive features 34U (e.g., UBMs) and the dielectric layer 32D.

The carrier 20 is then de-bonded from the redistribution structure 40. In the de-bonding process, a light beam (which may be a laser beam) is projected on the release film 22, and the light beam penetrates through the transparent carrier 20. The release film 22 is thus decomposed. The carrier 20 may be lifted off from the release film 22, and hence the package component 100 is de-bonded (demounted) from the carrier 20.

Figure 3:
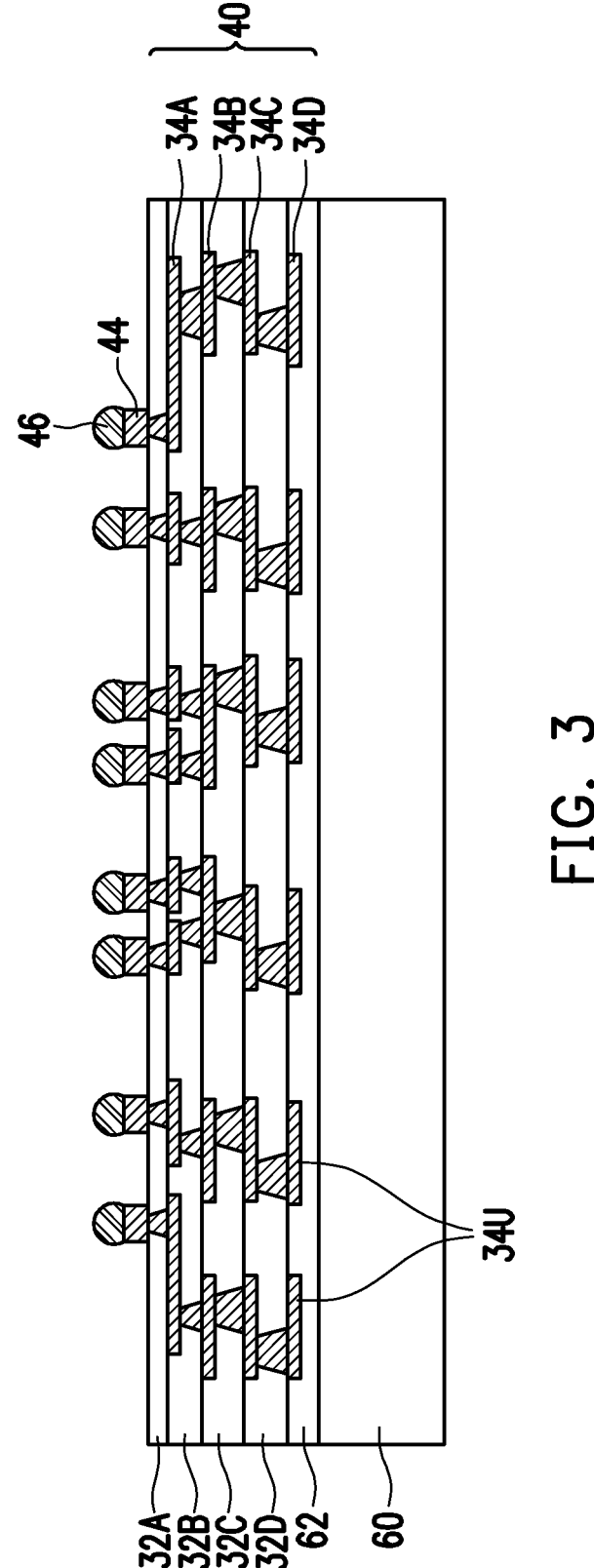

FIG. 3 illustrates the formation of UBMs 44 and conductive connectors 46 over the RDLs 34A, in accordance with some embodiments. The UBMs 44 may be formed of or comprise nickel, copper, titanium, or multi-layers thereof. The conductive connectors 46 are then formed on the UBMs 44. The formation of the conductive connectors 46 may include placing solder balls on the exposed portions of the UBMs 44, and then reflowing the solder balls, and hence the conductive connectors 46 are solder regions. In accordance with some embodiments, the formation of the conductive connectors 46 includes performing a plating process to form solder layers, and then reflowing the solder layers. The conductive connectors 46 may also include non-solder metal pillars, or may have composite structures including metal pillars and solder caps over the non-solder metal pillars, which may also be formed through plating.

Figure 4:
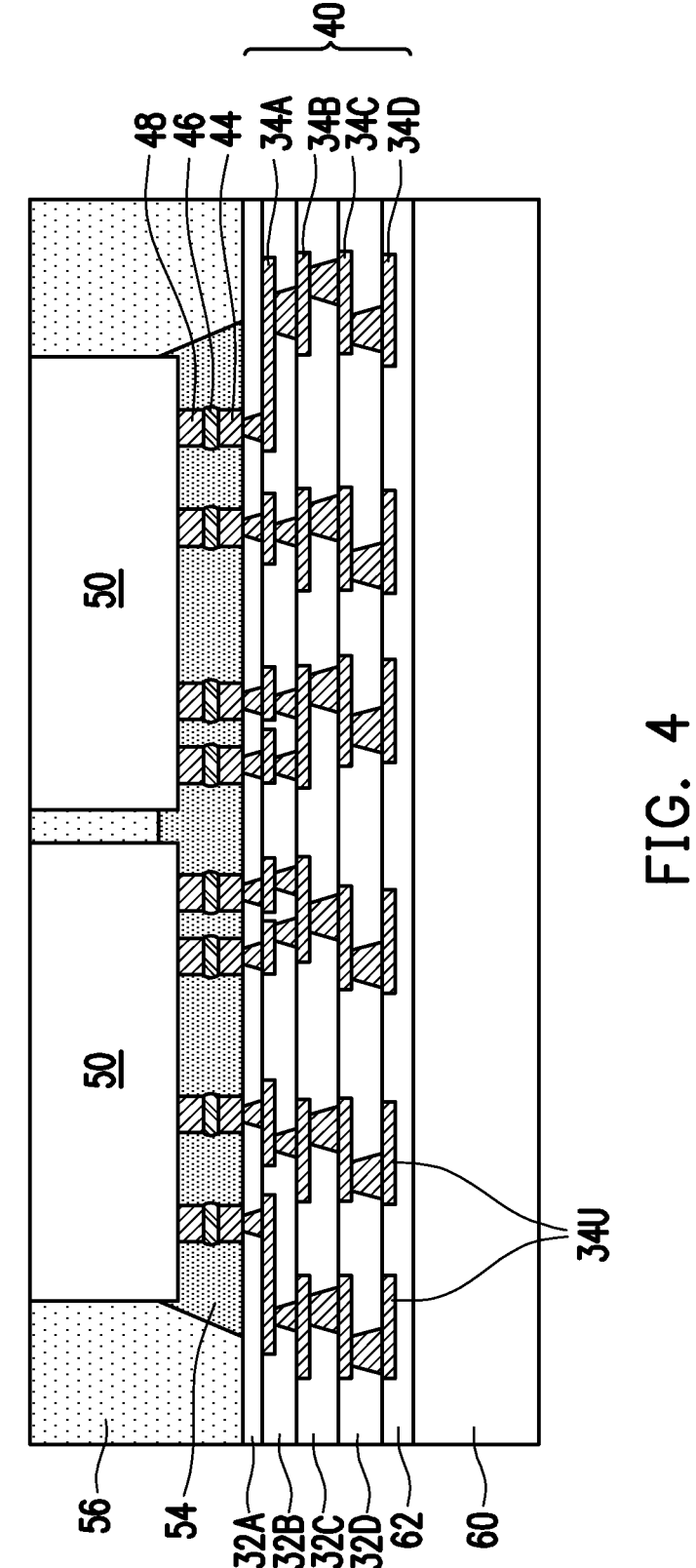

In FIG. 4, a plurality of integrated circuit devices 50 (e.g., device dies) are bonded to the redistribution structure 40 through the conductive connectors 46. In accordance with some embodiments, integrated circuit devices 50 include a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Integrated circuit devices 50 may also include a memory die(s) such as Dynamic Random-Access Memory (DRAM) dies, Static Random-Access Memory (SRAM) dies, or the like. The memory dies may be discrete memory dies, or may be in the form of a die stack that includes a plurality of stacked memory dies. Integrated circuit devices 50 may also include System-on-Chip (SOC) dies.

Die connectors 48 are disposed along the integrated circuit devices 50. The die connectors 48 may be conductive pillars, pads, or the like, to which external connections are made. The die connectors 48 can be formed of a metal, such as copper, aluminum, or the like, and can be formed by, for example, plating, or the like. In an embodiment the die connectors 48 may be microbumps, ball grid array (BGA) connectors, solder balls, metal pillars, controlled collapse chip connection (C4) bumps, electroless nickel-electroless palladium-immersion gold technique (ENEPIG) formed bumps, or the like. The die connectors 48 may include a conductive material such as solder, copper, aluminum, gold, nickel, silver, palladium, tin, the like, or a combination thereof. In some embodiments, the die connectors 48 are formed by initially forming a layer of solder through evaporation, electroplating, printing, solder transfer, ball placement, or the like.

In the illustrated embodiment, the integrated circuit devices 50 are attached to the redistribution structure 40 with conductive connectors 46, such as solder bonds. Once a layer of solder has been formed on the UBMs 44, a reflow may be performed in order to shape the conductive connectors 46 into desired bump shapes. Attaching the integrated circuit devices 50 may include using, for example, a pick and place tool to place the integrated circuit devices 50 on the redistribution structure 40 and reflowing the conductive connectors 46. The conductive connectors 46 form joints between corresponding UBMs 44 along the redistribution structure 40 and die connectors 48 of the integrated circuit devices 50, thereby electrically connecting the redistribution structure 40 to the integrated circuit devices 50.

Next, underfill 54 is dispensed into the gap between integrated circuit devices 50 and the underlying redistribution structure 40. Integrated circuit devices 50 are then encapsulated in encapsulant 56, which may include a molding compound, a molding underfill, or the like. The encapsulant 56 may include a base material, which may be a polymer, a resin, an epoxy, or the like, and filler particles in the base material. The filler particles may be dielectric particles of silica, alumina, boron nitride, or the like, and may have spherical shapes.

Figure 5:
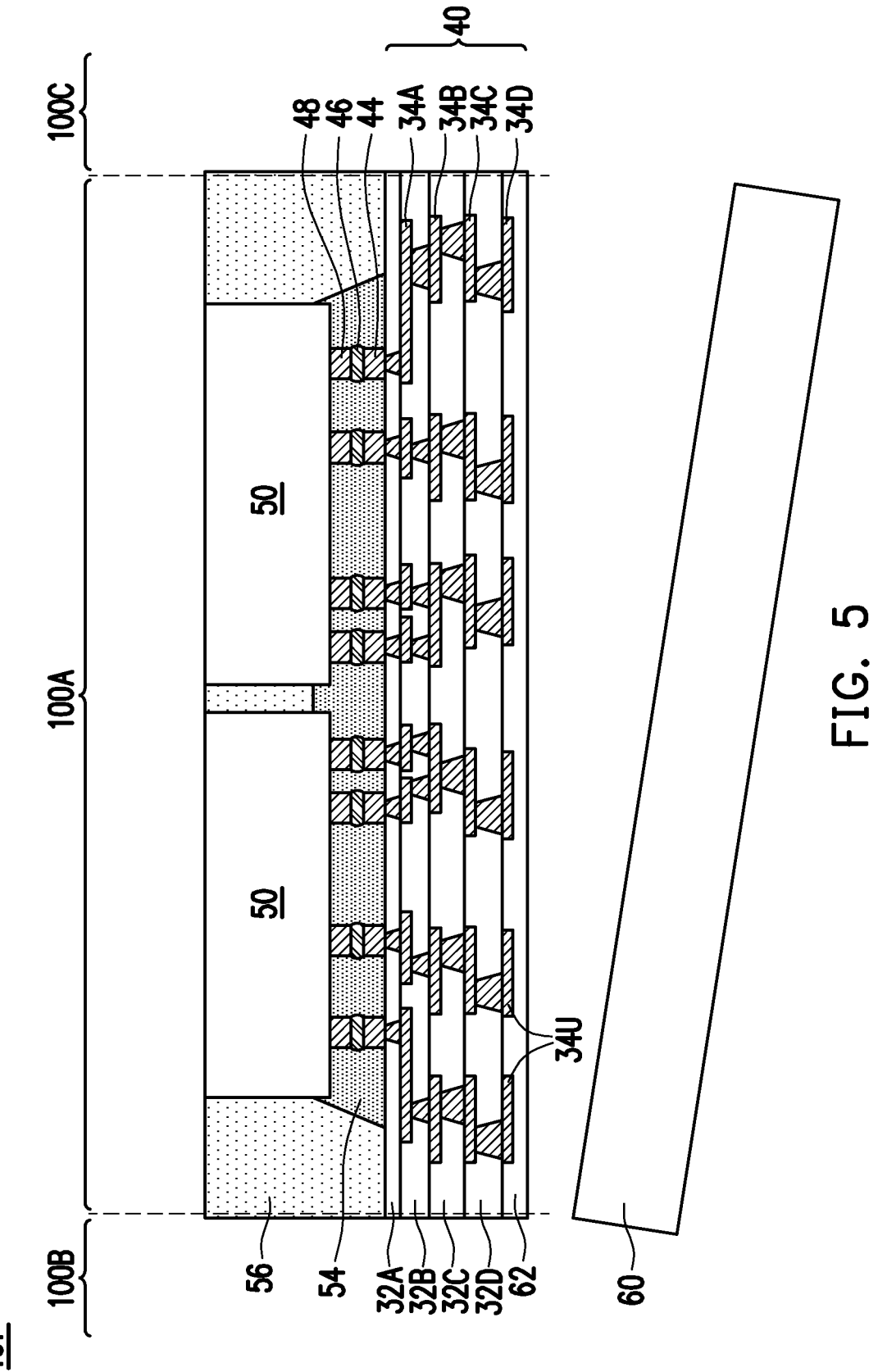

FIGS. 5-7B illustrate a process to de-bonded (demounted) package components 100 from carrier 60. As illustrated, the package components 100 are continued to be formed at the wafer level, which is separated from the carrier 60. For example, the semiconductor wafer containing the package components 100 may be referred to as wafer 101. In FIG. 5, the de-bonding may be initiated, for example, by projecting a light beam (which may be a laser beam) on release film 62, and the light beam penetrates through the transparent carrier 60. Material properties of the release film 62 are changed, such as decreasing a viscosity of release film 62 to loosen carrier 60. Carrier 60 is lifted off from release film 62, and hence the package components 100 are de-bonded (demounted) from carrier 60. As illustrated, some or all of release film 62 may remain along the wafer 101 (e.g., containing the package components 100).

Figure 6A:
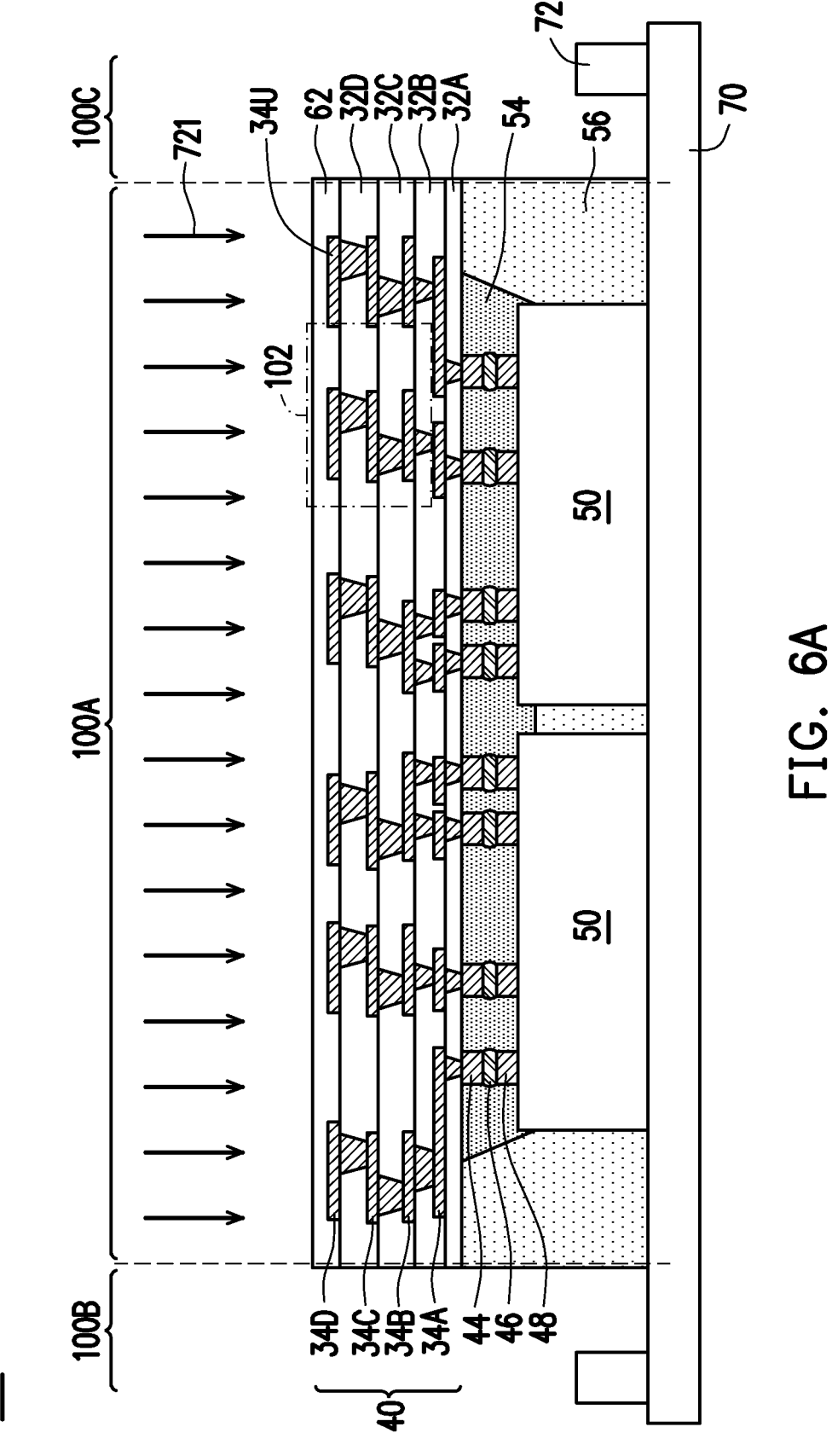
Figure 6B:
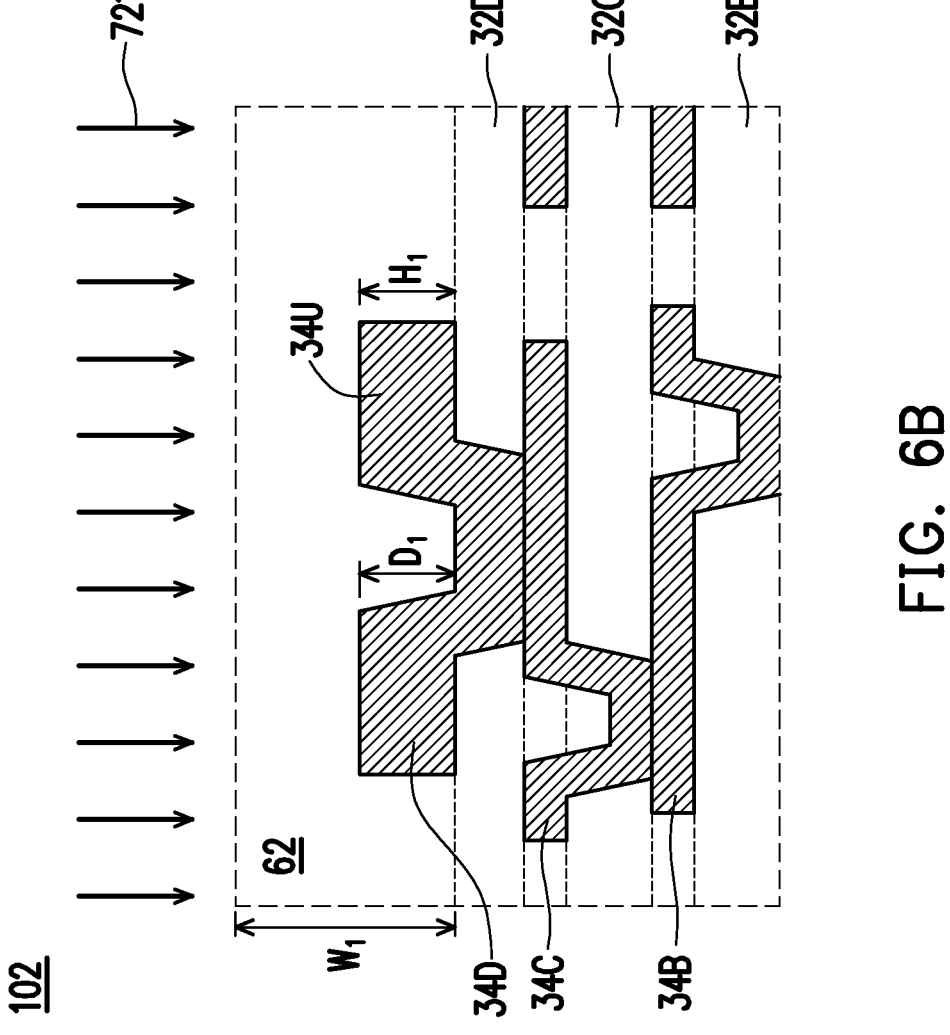

In FIGS. 6A-6B, an etch process is initiated to remove the release film 62 from the package component 100. FIG. 6B is a zoomed-in view of region 102 of the package component 100. After de-bonding the carrier 60 and before performing the etch process, the wafer 101 is placed on tape 70, which may be fixed on a frame 72. The etch process is designed to achieve uniform removal of the release film 62 on all package components 100 (e.g., package components 100A, 100B, 100C, etc.) across all portions of the wafer 101. Uniform removal of the release film 62 has greater importance due to the uneven surfaces of the conductive features 34U (e.g., UBMs) along the uppermost dielectric layer 32 (e.g., the dielectric layer 32D). For example, remaining portions of the release film may have a thickness $T_1$ ranging from 10 μm to 50 μm, such as ranging from 40 μm to 50 μm. In addition, the conductive features 34U may extend above an upper surface of the dielectric layer 32D by a height $H_1$ ranging from 10 μm to 20 μm, such as 15 μm. Further, a middle portion of the conductive feature 34U may have a depth $D_1$ ranging from 10 μm to 12 μm.

FIGS. 7A-7D illustrate a treatment system, and certain components thereof, used to perform the etch process to uniformly remove the release film 62 from the wafer 101, in accordance with some embodiments. Note that the wafer 101 in which the package components 100 are formed is a 300 mm wafer, although any suitable wafer size may be utilized with a treatment system having proportionate dimensions as those discussed below. The treatment system may be a remote plasma system which utilizes precursor material(s) including, for example, oxygen, nitrogen, carbon tetrafluoride, argon, the like, combinations thereof, or suitable materials.

Figure 7A:
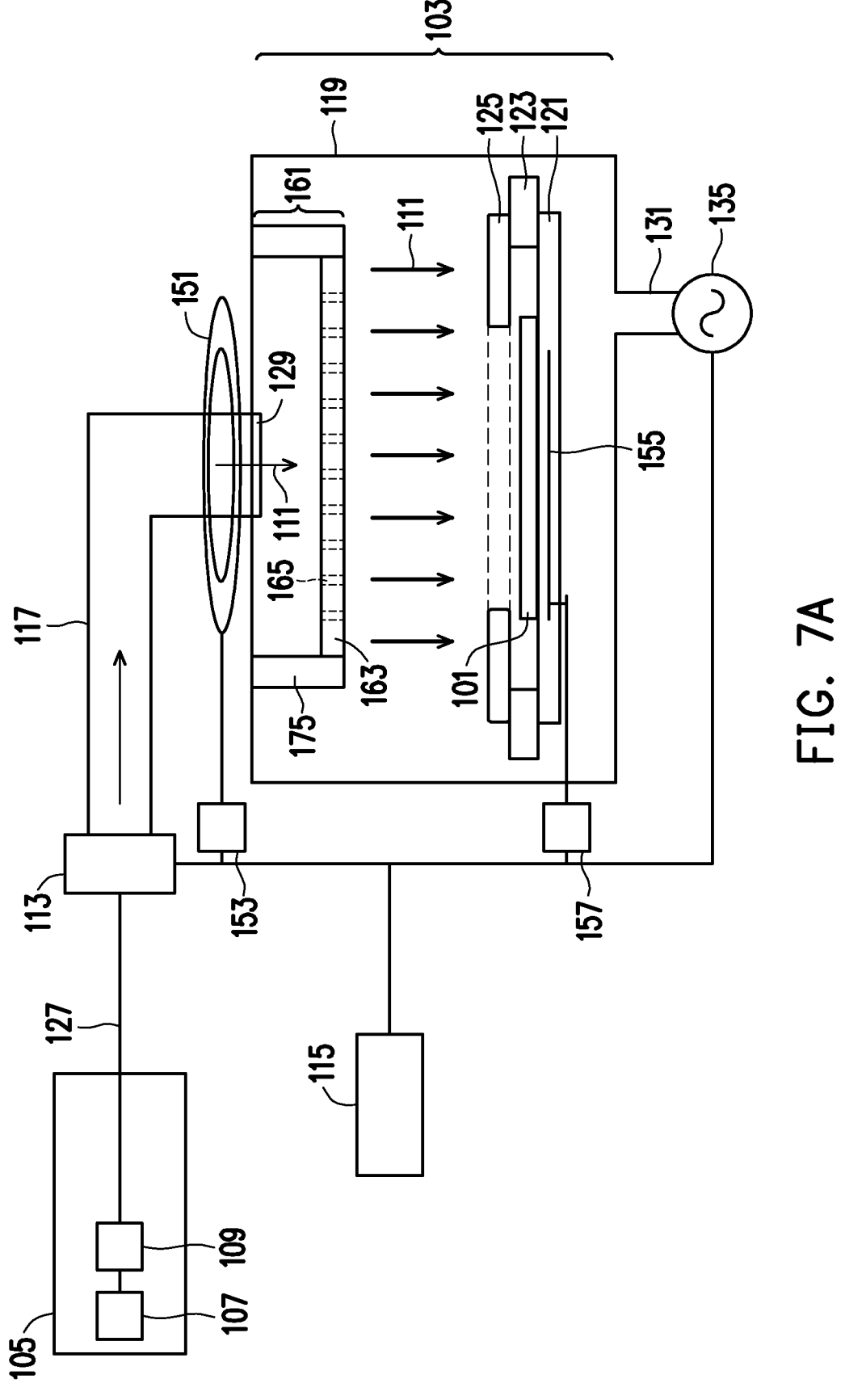
FIGS. 7A-7D illustrate schematics of a treatment system and components thereof, in accordance with some embodiments.

FIG. 7A illustrates an exemplary treatment system that may be used to perform the etch process to remove the release film 62 from the wafer 101, in accordance with some embodiments. The treatment system is designed to deliver etchants to the wafer 101 in such a way that the wafer 101 receives a uniform distribution of the etchants. In some embodiments, the treatment system is a remote plasma treatment system which uses treatment plasma to etch the release film 62.

The treatment system may receive one or more treatment precursors from one or more precursor delivery systems 105 which work to supply the desired precursor material(s) to the treatment chamber 103 through, among other things, a precursor gas controller 113. In some embodiments, the precursor delivery system 105 includes a gas supply 107 and a flow controller 109, wherein the gas supply 107 may be a vessel, such as a gas storage tank, that is located either locally to the treatment chamber 103 or else may be located remotely from the treatment chamber 103. For example, the gas supply 107 may be a facility that independently prepares and delivers the treatment precursor to the flow controller 109. Any suitable source for the treatment precursor may be utilized as the gas supply 107, and all such sources are fully intended to be included within the scope of the embodiments.

In addition, in embodiments in which the treatment precursor is stored in a solid or liquid state, the gas supply 107 may store a carrier gas and the carrier gas may be introduced into a precursor canister (not specifically illustrated), which stores the treatment precursor in the solid or liquid state. The carrier gas is then used to push and carry the treatment precursor as it either evaporates or sublimates into a gaseous section of the precursor canister before being sent through a gas line 127 to the precursor gas controller 113. Any suitable method and combination of units may be utilized to provide the treatment precursor, and all such combination of units are fully intended to be included within the scope of the embodiments.

The gas supply 107 may supply the desired treatment precursor to the flow controller 109 through a supply line, such as a gas line 127. The flow controller 109 may be utilized to control the flow of the treatment precursor to the precursor gas controller 113 and, eventually, to the treatment chamber 103, thereby also helping to control the pressure within the treatment chamber 103. The flow controller 109 may be, e.g., a proportional valve, a modulating valve, a needle valve, a pressure regulator, a mass flow controller, combinations of these, or the like. However, any suitable method for controlling and regulating the flow of the treatment precursor to the precursor gas controller 113 may be utilized, and all such components and methods are fully intended to be included within the scope of the embodiments.

As one of ordinary skill in the art will recognize, although the precursor delivery system 105 has been described herein as having particular components, this is merely an illustrative example and is not intended to limit the embodiments in any fashion. Any type of suitable precursor delivery system, with any type and number of individual components, may be utilized. All such precursor delivery systems are fully intended to be included within the scope of the embodiments.

The precursor delivery system 105 may supply its precursor materials through a gas line 127 into the precursor gas controller 113 which may connect and isolate the precursor delivery system 105 before supplying the precursor materials through a manifold 117 to the treatment chamber 103 in order to deliver the desired precursor material to the treatment chamber 103 at a desired rate. The precursor gas controller 113 may include such devices as valves, flow meters, sensors, and the like to control the delivery rate of the treatment precursor, and may be controlled by instructions received from the control unit 115. The precursor gas controller 113, upon receiving instructions from the control unit 115, may open and close valves so as to connect the precursor delivery system 105 to the treatment chamber 103 and direct the desired treatment through the manifold 117.

The treatment system may further include one or more plasma generators, including a remote plasma generator (e.g., remote from the treatment chamber 103), in accordance with some embodiments. For example, an upper electrode 151 may be located at the manifold 117 and be used as a plasma generator, e.g., to convert the precursor materials into a treatment plasma 111. In some embodiments, the plasma generator (e.g., the upper electrode 151) may be a transformer coupled plasma generator and may be, e.g., a coil. The coil may be attached to a first radio frequency (RF) generator 153 that is utilized to provide power to the upper electrode 151 (under control of the control unit 115) in order to ignite or convert the precursor material into the treatment plasma 111 during or just before introduction into the treatment chamber 103.

Although the upper electrode 151 is described above as a transformer coupled plasma generator, embodiments are not intended to be limited to a transformer coupled plasma generator. Rather, any suitable method of generating the plasma, such as inductively coupled plasma systems, an electron cyclotron resonance, or the like, may also be utilized. All such methods are fully intended to be included within the scope of the embodiments.

In addition, a lower electrode 155 may be located within the treatment chamber 103 and may be included within or adjacent to the mounting platform 121. The lower electrode 155 may be coupled to a second RF generator 157. The lower electrode 155 may be electrically biased by the second RF generator 157 (under control of the control unit 115) at a RF voltage during the treatment process. By being electrically biased, the lower electrode 155 is used to provide a bias to the incoming treatment plasma 111 and assist to further ignite or convert any remaining precursor material into the treatment plasma 111. In addition, the lower electrode 155 maintains the electrical bias in order to attract the treatment plasma 111 downward to the wafer 101 and to maintain the treatment plasma 111 at the wafer 101 during the process. Each of the first and second RF generators 153, 157 may utilize microwave radiation, infrared radiation, chamber pressure, combinations thereof, or any suitable energies and frequencies.

For example, once the treatment plasma 111 has been generated, the treatment plasma 111 may be directed into the treatment chamber 103. The treatment chamber 103 receives the treatment plasma 111 at an inlet 129 and directs the treatment plasma 111 downward through a showerhead 161 to expose the underlying wafer 101 with the treatment plasma 111. The showerhead 161 includes a skirt ring 175 adjacent and along a ceiling of a housing 119 of the treatment chamber 103. The skirt ring 175 prevents lateral flow of the treatment plasma 111 from the showerhead 161. The showerhead 161 also includes a diffusion plate 163 attached to the skirt ring 175. The diffusion plate 163 has a plurality of holes 165 through which the treatment plasma 111 may be directed downward (e.g., substantially vertical) to the wafer 101, for example, to enable directional or anisotropic etching. As discussed in greater detail below, the holes 165 may have varying sizes and layouts to increase uniformity of the treatment plasma 111 reaching all parts of the wafer 101. As illustrated, the showerhead 161 may be designed in a closed-cell layout, such that the diffusion plate 163 is bound by the skirt ring 175, thereby providing greater control of the directionality of the treatment plasma 111.

The treatment chamber 103 may also have an exhaust outlet 131 for exhaust gases to exit the housing 119 of the treatment chamber 103. A vacuum pump 133 may be connected to the exhaust outlet 131 of the treatment chamber 103 in order to help evacuate the exhaust gases. The vacuum pump 133, under control of the control unit 115, may also be utilized to reduce and control the pressure within the treatment chamber 103 to a desired pressure and may also be utilized to evacuate precursor materials from the treatment chamber 103.

Sidewalls of the housing 119 of the treatment chamber 103 may form a cylindrical shape (e.g., circular shape) or rectangular shape (e.g., square shape). In addition, sidewalls of the showerhead 161 (e.g., the skirt ring 175) may form a cylindrical shape (e.g., circular shape) or rectangular shape (e.g., square shape), which may be similar or different from the shape of the sidewalls of the treatment chamber 103. Note that the treatment chamber 103 and the skirt ring 175 are not limited to these shapes, and any other suitable shape, such as a hollow square tube, an octagonal shape, or the like, may be utilized. Furthermore, the housing 119 may be made of material that is inert to the various process materials (e.g., the treatment plasma 111 and the exhaust gases). As the housing 119 may be any suitable material that can withstand the chemistries and pressures involved in the etch process, in some embodiments, the housing 119 may be steel, stainless steel, nickel, aluminum, alloys of these, combinations of these, and like. In accordance with some embodiments, the housing 119 may be 19 to 20 liters in size, and the diffusion plate 163 may be a close distance to the wafer 101 (e.g., less than 70 mm, such as 68 mm) to maintain the substantially vertical angle at which the treatment plasma 111 reaches the wafer 101. Note that any similar and suitable dimensions within the housing 119 may be utilized.

Within the housing 119, the wafer 101 is placed on a mounting platform 121 and secured with a frame 123 in order to position and control the wafer 101 during the etch process. A guide ring 125 may also be positioned over the wafer 101 and have an opening centered over the wafer 101 to direct the treatment plasma 111 downward onto the wafer 101 at a substantially vertical angle.

Referring specifically to the showerhead 161, in embodiments in which the skirt ring 175 has circular sidewalls, the diffusion plate 163 has a circular shape and may extend an entirety between the sidewalls of the skirt ring 175. For example, the diffusion plate 163 may have a diameter ranging from 300 mm to 400 mm, such as 350 mm to 352 mm, and the skirt ring 175 may have an outer diameter of 380 mm to 450 mm. In embodiments in which the skirt ring 175 has a larger diameter or a rectangular (e.g., square) shape, the holes 165 of the diffusion plate 163 may not span the entirety between sidewalls of the skirt ring 175. In addition, each hole 165 within the diffusion plate 163 may have a diameter of 1 mm±50% and have a pitch between one another of 5 mm±50%. A total area of the holes 165 may compose 10% to 30% (e.g., 20%) of a total area of the diffusion plate 163, while 70% to 90% (e.g., 80%) of the total area of the diffusion plate 163 blocks flow of the treatment plasma 111.

Figure 7B:
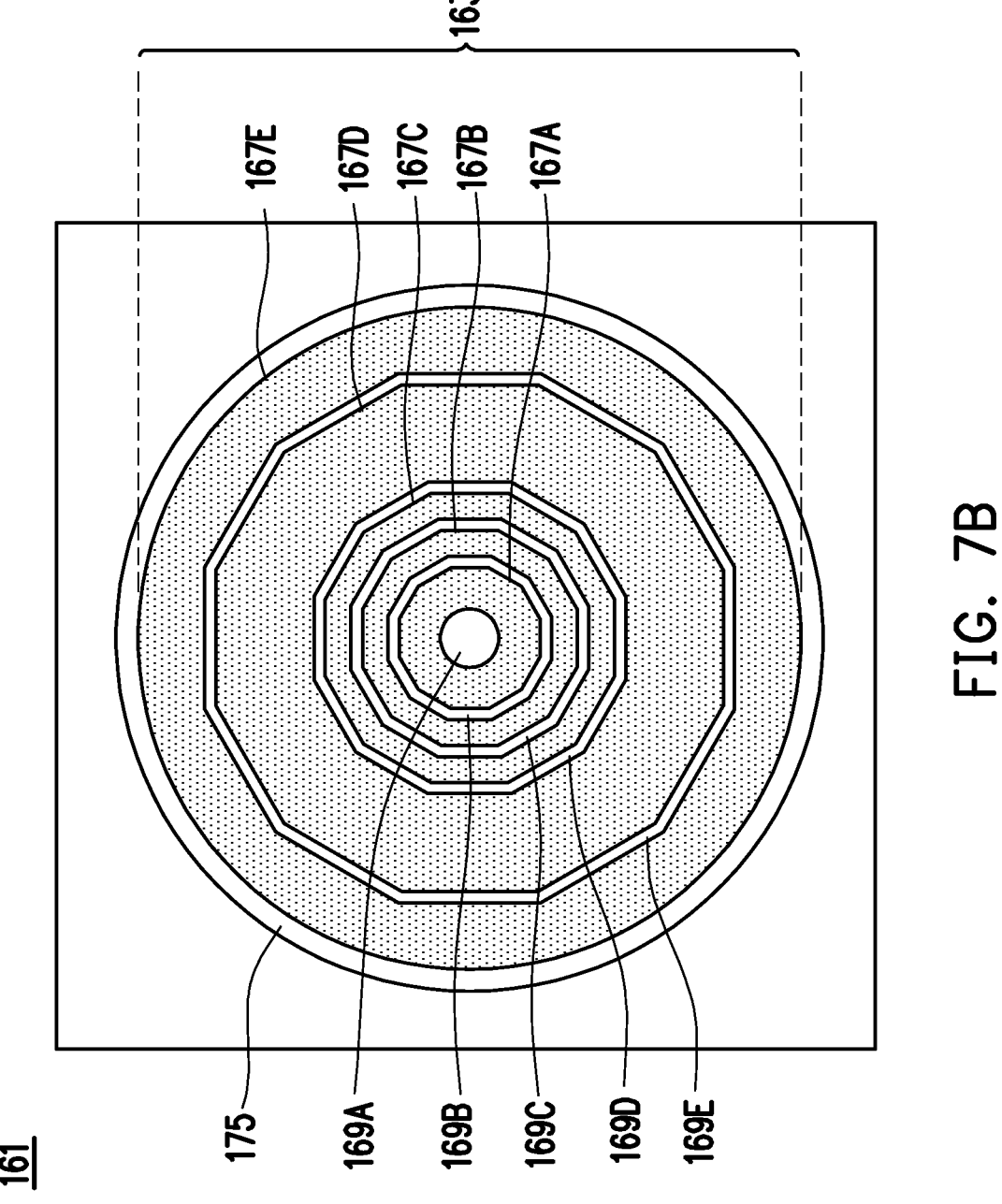
Figure 7C:
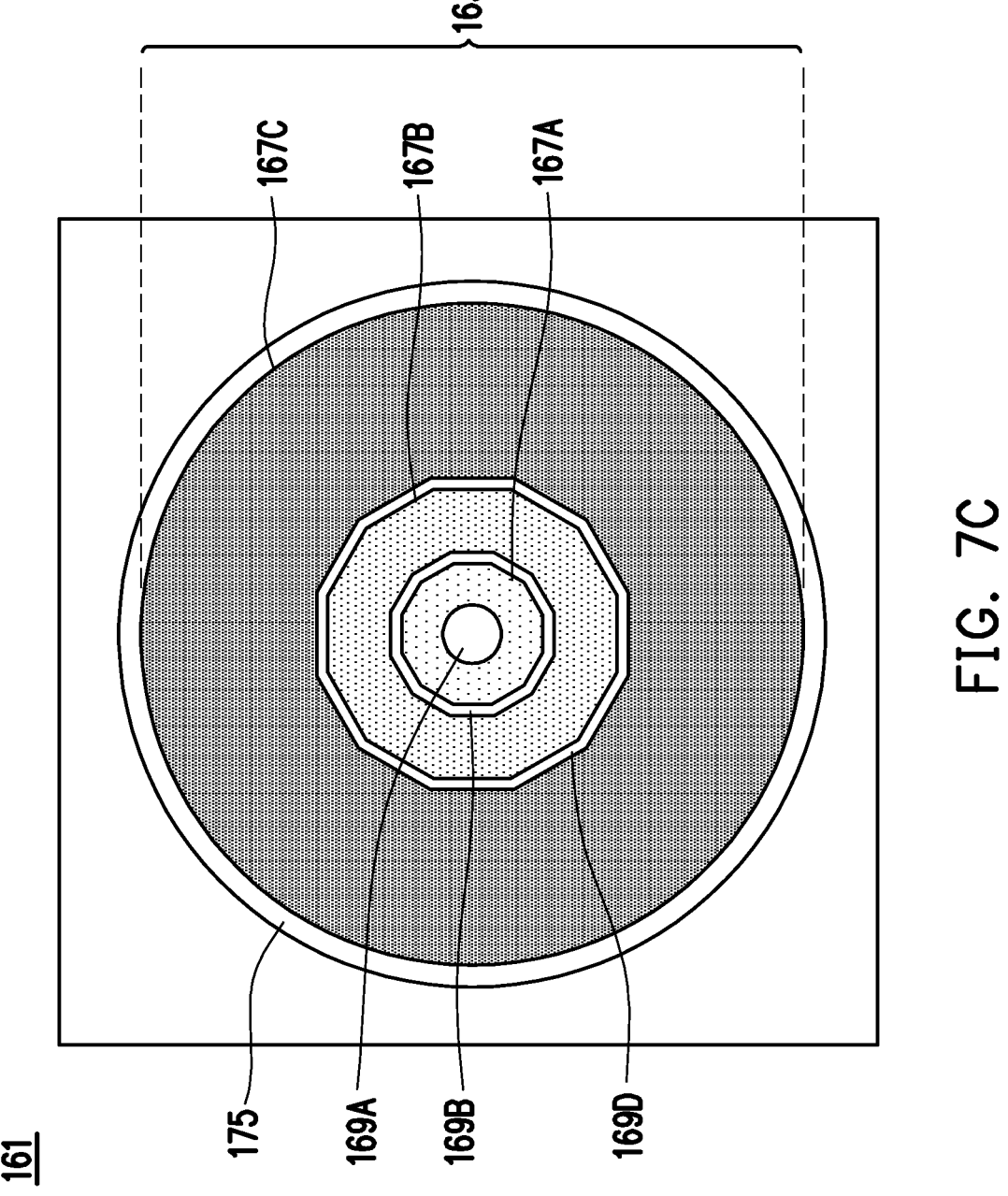
Figure 7D:
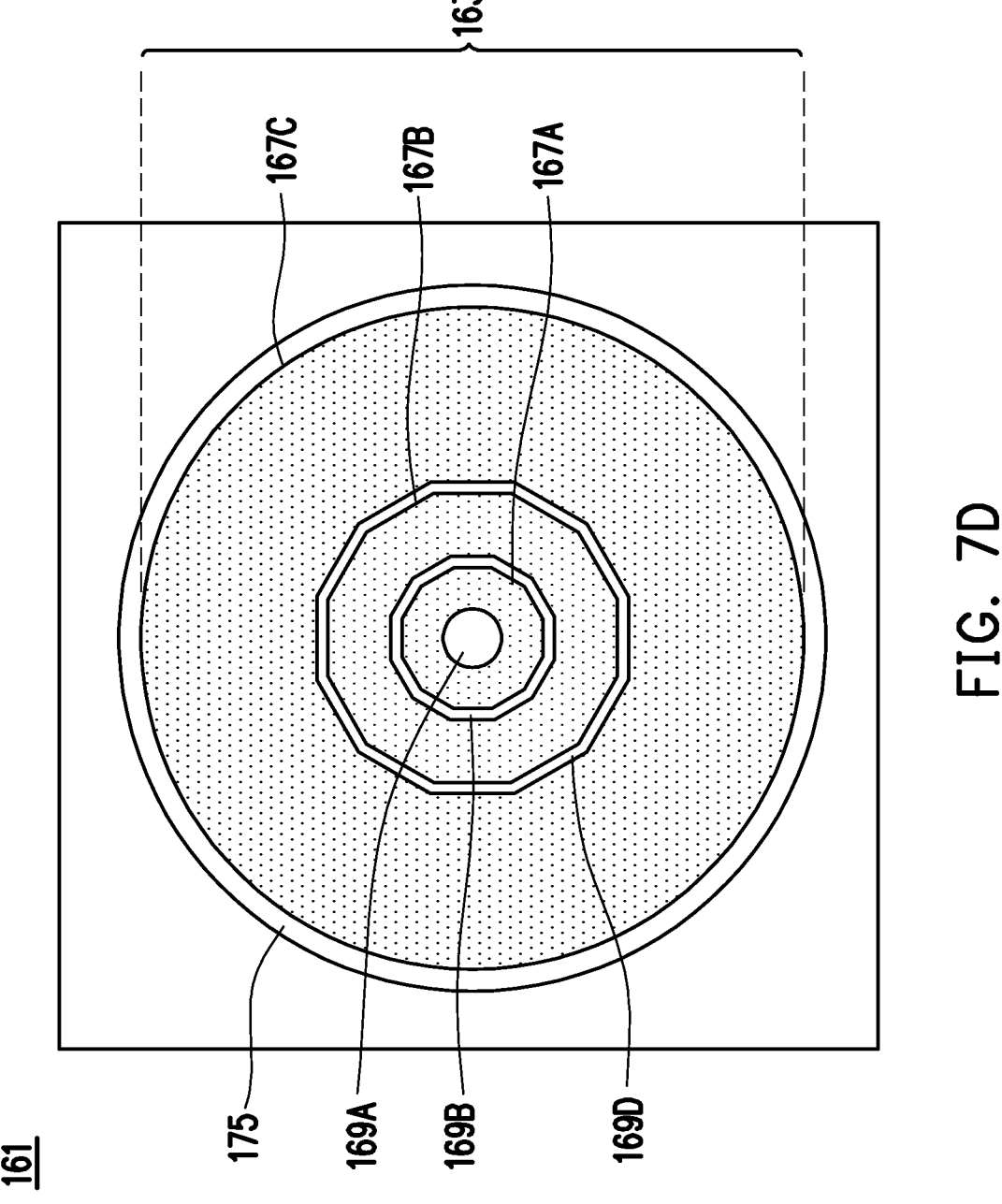

FIGS. 7B-7D illustrate plan views of exemplary showerheads 161 (e.g., exemplary diffusion plates 163), in accordance with various embodiments. As illustrated, the holes 165 of the diffusion plate 163 may be grouped or clustered in a plurality of concentric rings 167 and separated from one another by dividers 169 (e.g., flow inhibiting regions). Note that the dividers 169 may have dodecagonal shapes (as illustrated), decagonal shapes, octagonal shapes, hexagonal shapes, circular shapes, or any suitable shapes. The layout of the concentric rings 167 and the dividers 169 increases the uniformity of distributing the treatment plasma 111 into the rest of the housing 119 and onto the surface of the wafer 101. Computer simulations were conducted to determine these layouts for improving the uniformity of the treatment plasma 111 reaching the wafer 101 and, for example, etching the release film 62. In general, preferred layouts may provide lesser flow (e.g., inhibiting flow) of the treatment plasma 111 (e.g., inhibited by the dividers 169) at or proximal to a center region of the diffusion plate 163 while allowing greater flow at an outer region of the diffusion plate 163.

Referring to FIG. 7B, in accordance with some embodiments, the diffusion plate 163 of the showerhead 161 may include five concentric rings 167 (e.g., from innermost to outermost being labeled 167A, 167B, 167C, 167D, and 167E), although the diffusion plate 163 may include fewer or more than five concentric rings 167. For example, the concentric ring 167A (e.g., the innermost) may be within an outer diameter of 80 mm, the concentric ring 167B may be within an outer diameter of 120 mm, the concentric ring 167C may be within an outer diameter of 160 mm, the concentric ring 167D may be within an outer diameter of 280 mm, and the concentric ring 167E may be within an outer diameter being the same diameter as the diffusion plate 163 (e.g., 352 mm). Note that each of the listed dimensions may vary, such as by ±10% or by ±5 mm. As illustrated, the dividers 169 (e.g., from innermost to outermost being labeled 169A, 169B, 169C, 169D, and 169E) separate the concentric rings 167 from another. Note that the innermost divider 169A is within the innermost concentric ring 167A to block flow of the treatment plasma 111 through the center region of the diffusion plate 163.

The diffusion plate 163 may have hole densities (e.g., densities by surface area of the holes 165) that vary based on distance from the center region and/or by proximity of each concentric ring 167 from the center region. The hole density may be calculated or measured as a ratio of the total area of the corresponding holes 165 to the total area of the corresponding portion of the diffusion plate 163. For example, for a circle with a diameter of 80 mm (e.g., including the concentric ring 167A and the divider 169A), the diffusion plate 163 may have a hole density of 2.00%. In addition, for a circle with a diameter of 120 mm (e.g., including the concentric rings 167A, 167B and the dividers 169A, 169B), the hole density may be 2.25%. Further, the hole density may be 3.00% for a circle with a diameter of 160 mm (e.g., including the concentric rings 167A, 167B, 167C and the dividers 169A, 169B, 169C), the hole density may be 3.53% for a circle with a diameter of 240 mm (e.g., including the concentric rings 167A, 167B, 167C, 167D and the dividers 169A, 169B, 169C, 169D), and the hole density may be 3.81% for a circle with the full diameter of the diffusion plate 163 such as 350 mm to 352 mm (e.g., including all of the concentric rings 167 and all of the dividers 169). Note that each of the hole densities may be within ±50% of the dimensions listed above. In addition, in some embodiments, the hole densities increase with the increasing sizes of the circles identified above.

In addition, beyond the innermost divider 169A, the other dividers 169B-169E may have the same widths, increasing widths, or decreasing widths. For example, the innermost divider 169A may have a diameter of about 10% of the total diameter of the diffusion plate 163, such as a diameter ranging from 30 mm to 40 mm (e.g., 35 mm), and each of the dividers 169B-169E may have a width ranging from 5 mm to 20 mm, or in some embodiments ranging from 20 mm to 320 mm.

FIGS. 7C and 7D illustrate additional embodiments of the diffusion plate 163 of the showerhead 161 which emphasize varying hole densities based on each of the concentric rings 167 (e.g., as opposed to hole densities within circles of increasing diameters as discussed above). As illustrated, and for the benefit of simplicity, the diffusion plate 163 may include three concentric rings 167 (e.g., an inner ring 167A, an intermediate ring 167B, and an outer ring 167C) and three dividers 169 (e.g., a first divider 169A at the center region, a second divider 169B, and a third divider 169C).

For example, the inner ring 167A (e.g., the innermost) may encircle the first divider 169A and be bound within the second divider 169B (e.g., having a diameter of 80 mm), the intermediate ring 167B may encircle the second divider 169B and be bound within the third divider 169C (e.g., having a diameter of 160 mm), and the outer ring 167C may encircle the third divider 169C and with an outer diameter being the same diameter as the diffusion plate 163 (e.g., 352 mm). Note that each of the listed dimensions may vary, such as by ±10% or by ±5 mm. The concentric rings 167 and the dividers 169 of the diffusion plates 163 discussed in connection to FIGS. 7C and 7D may have analogous layouts and dimensions as the concentric rings 167 and dividers 169 described above in connection with FIG. 7B, unless otherwise specified. Also note that the embodiments described in connection with FIGS. 7C and 7D may also apply to diffusion plates 163 having two concentric rings 167 or greater than three concentric rings 167 (e.g., having the five concentric rings as described above with FIG. 7B).

In regard to FIGS. 7C and 7D, a hole density may be calculated or measured for each of the concentric rings 167, and these hole densities may increase from innermost to outermost (e.g., from the inner ring 167A to the outer ring 167C). For example, the hole density of each concentric ring 167 may be calculated as a ratio of the total area of the corresponding holes 165 within a concentric ring 167 to the total area of that concentric ring 167. Note that this differs from the hole density calculations and measurements discussed above with FIG. 7B, which pertain to hole densities across entire circles having particular diameters.

In embodiments represented in FIG. 7C, the hole density increases due to a hole 165 pitch that decreases from the first concentric ring 167A to the third concentric ring 167C. For example, a pitch between the holes 165 of the inner ring 167A may be 7 mm to 7.5 mm, a pitch of the intermediate ring 167B may be 4.5 mm to 5.5 mm (e.g., 5 mm), and a pitch of the outer ring 167C may be 2 mm to 2.5 mm. In addition, a hole density of the inner ring 167A may be 0.5% to 2.5%, a hole density of the intermediate ring 167B may be 2% to 3.5%, and a hole density of the outer ring 167C may be 3% to 4.5%. As noted above, these embodiments (e.g., varying hole density by varying the pitch) may be applied to the embodiments discussed in connection with FIG. 7B.

In embodiments represented in FIG. 7D, the hole density increases due to an individual hole area that increases from the first concentric ring 167A to the third concentric ring 167C. For example, an individual hole area in the inner ring 167A may be 0.5 mm to 1.0 mm, an individual hole area in the intermediate ring 167B may be 0.75 mm to 1.25 mm, and an individual hole area in the outer ring may be 1.0 mm to 1.5 mm. In addition, and similarly as above in connection with FIG. 7C, a hole density of the inner ring 167A may be 0.5% to 2.5%, a hole density of the intermediate ring 167B may be 2% to 3.5%, and a hole density of the outer ring 167C may be 3% to 4.5%. As noted above, these embodiments (e.g., varying hole density by varying the individual hole area) may be applied to the embodiments discussed in connection with FIG. 7B.

It should be appreciated that combinations of the features described in connection with FIGS. 7C and 7D may be utilized, such as decreasing pitch and increasing individual hole area from the inner ring 167A to the outer ring 167C. In addition, these two parameters may be utilized in reverse, such that both increase or both decrease from the inner ring 167A to the outer ring 167C. In either case, the hole densities may increase or remain substantially the same from innermost to outermost of the concentric rings 167. Further, these features may be utilized in embodiments of the diffusion plate 163 having more than three concentric rings 167 (e.g., having the five concentric rings 167 as described above in connection with FIG. 7B).

Figure 8A:
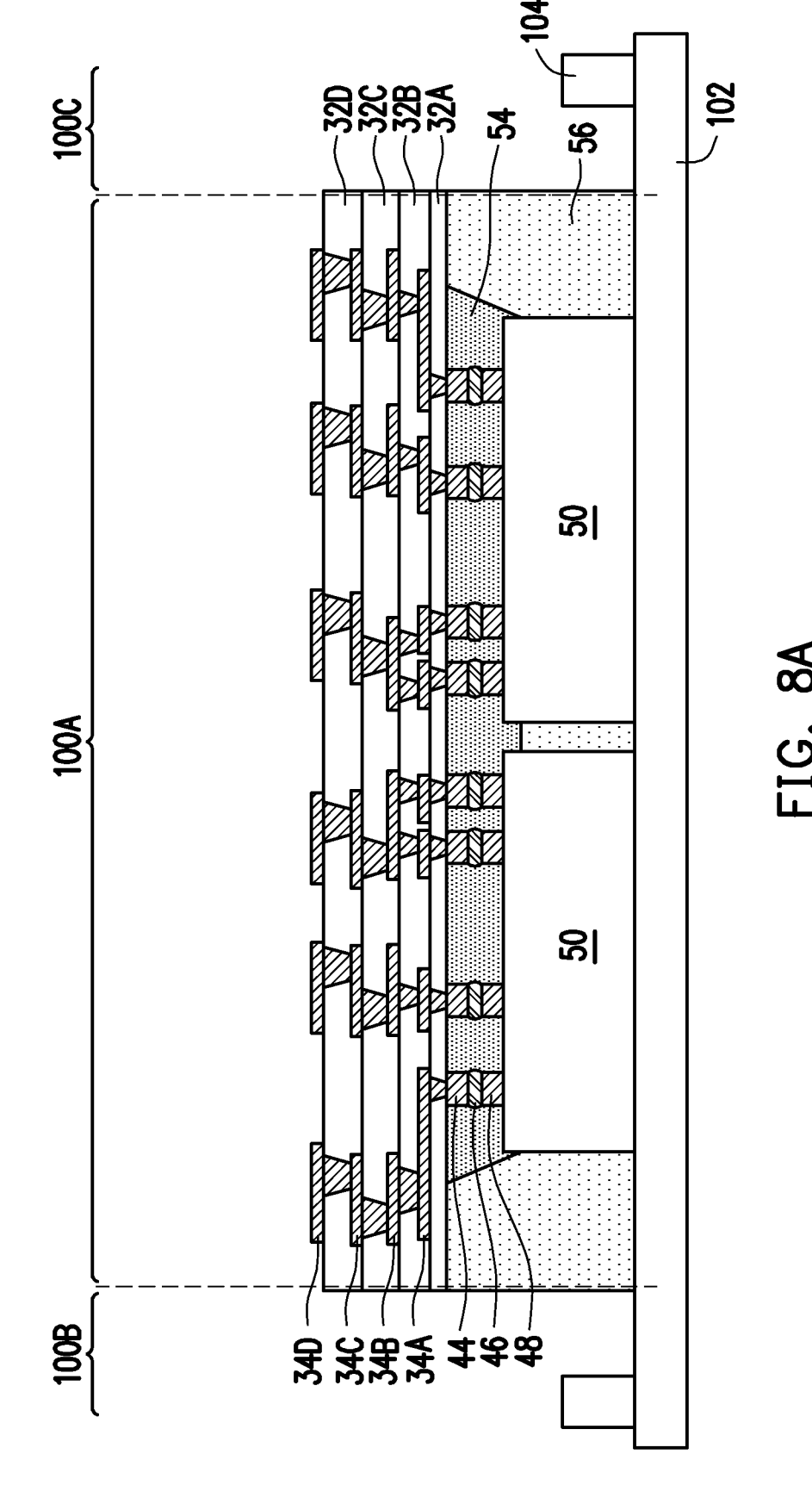
FIGS. 8A, 8B, and 9 illustrate cross-sectional views of intermediate stages in the formation of a semiconductor package, in accordance with some embodiments.
Figure 8B:
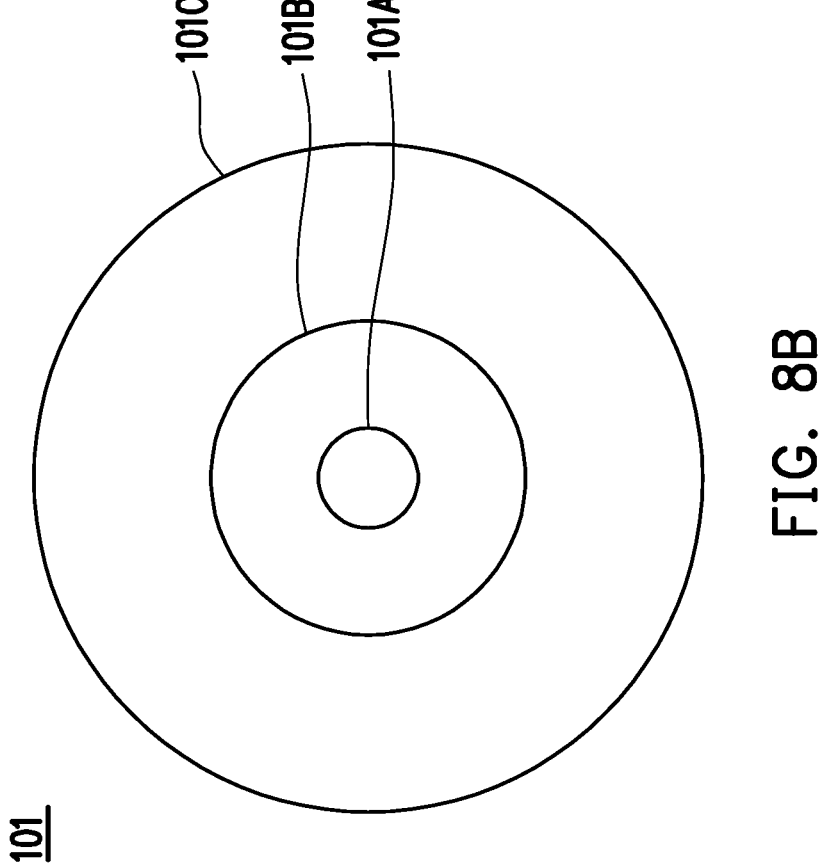

In FIGS. 8A and 8B, the etch process results in a uniform removal of release film 62 from all package components 100 within the wafer 101. Measurements of the etch rate and etch process results (e.g., uniformity) may be taken across the wafer 101, as depicted in FIG. 8B. In some embodiments, the measurements are performed during the etch process and/or after completion of the etch process. For example, differences may be measured and compared between a center region 101A, an intermediate region 101B, and an outer region 101C of the wafer 101. Some differences are expected after the etch process, and these differences are decreased by the treatment system and etch process described above (e.g., the diffusion plate 163 including the layout of the concentric rings 167 of the holes 165 and the dividers 169).

For example, the outer region 101C may extend from a half-diameter of the wafer 101 (e.g., 150 mm to 160 mm) outward to the outer edge of the wafer 101 (e.g., 300 mm). In addition, the intermediate region 101B may extend from the half-diameter of the wafer 101 (e.g., 150 mm to 160 mm) inward to a quarter-diameter of the wafer 101 (e.g., 70 mm to 80 mm). Further, the center region 101A may be an entirety of the quarter-diameter of the wafer 101 (e.g., 70 mm to 80 mm).

In some embodiments, the intermediate region 101B may be etched at a faster etch rate than the center region 101A and the outer region 101C. As a result, the intermediate region 101B may be over-etched as compared to the center region 101A and the outer region 101C in order to remove an entirety of the release film 62 across the entire wafer 101. In some embodiments, the etch process is completed or halted when the underlying dielectric layer 32 (e.g., dielectric layer 32D) is exposed in any portion of the wafer 101 (e.g., the intermediate region 101B). A cleaning process may then be performed after the etch process to remove any residue of the release film 62 that may be remaining (e.g., remaining in the center region 101A and the outer region 101C). The cleaning process may be an isotropic or an anisotropic rinse and performed by the same or a different treatment system.

Although the treatment plasma 111 is directed downward to the wafer 101, fluid dynamics within the housing 119 result in diffusion of the treatment plasma 111 in other directions. Embodiments of the diffusion plate 163 described above achieve uniform etch rates across the wafer 101 by distributing the flow of the treatment plasma 111 from the showerhead 161 to account for those fluid dynamics. For example, embodiments of the diffusion plate 163 direct and inhibit the flow of the treatment plasma 111 through the holes 165 (and blocked or inhibited by the dividers 169) based on the described layouts. As a result, etch rates in the center region 101A and the intermediate region 101B may decrease in order for both to be closer to the etch rate in the outer region 101C.

In accordance with some embodiments, removal of the release film 62 from the wafer 101 may have an average etch rate, which may range, e.g., from 0.8 μm/min to 1.0 μm/min, such as 0.85 μm/min. In addition, a range (e.g., difference) between a maximum etch rate and a minimum etch rate in different locations on the wafer 101 may be less than or equal to 0.1 μm/min, such as 0.09 μm/min. For example, the maximum-minimum range may be 10% or less than the average etch rate across the wafer 101. Further, three-sigma uniformity (e.g., greater than 99% uniformity) may be achieved at etch-rates within ±8% of the average etch rate. Moreover, a half-range (e.g., 50% of the maximum-minimum range) encompassing the average etch rate may be achieved across about 95% or more of the wafer 101 (e.g., 94.6% of the wafer 101). In various embodiments, at the halfway point of performing the etch process (e.g., 40 minutes) on a 40 µm thick release film 62, remaining portions of the release film 62 may have a thickness range of about 6 µm (e.g., 5.76 µm) or less ranging from 20 µm and 26 µm. In addition, about 94% or more of the wafer 101 may have thicknesses within the half-range (e.g., 3 µm).

In some embodiments, after removing remaining portions of release film 62, the package components 100 are singulated in a sawing process, and separated into the plurality of package components 100 (e.g., package components 100A-C) that have structures identical to each other. In some embodiments, the sawing process may be performed after the steps described below in connection with FIG. 9.

In some embodiments (not specifically discussed above in connection with FIGS. 1-2), the release film 22 may be a same or similar material as the release film 62 (e.g., a voidless coating) and be removed similarly as described in the etch process to remove the release film 62 (see FIGS. 6A-8B). In particular, these process steps may be advantageous in embodiments in which the release film 22 requires an etch process for complete removal having particular attention to avoiding damage to any underlying layers. For example, these process steps may be utilized when the release film 22 is disposed in a similarly voidless form along a side of the package component 100 having uneven surfaces. In addition, embodiments of the treatment system, (e.g., a treatment chamber 103 that includes embodiments of the showerhead 161 comprising the diffusion plate 163 and skirt ring 175) may be utilized in other processes (e.g., dry etching and dry cleaning processes) requiring high uniformity of etching other layers, such as photoresists.

Figure 9:
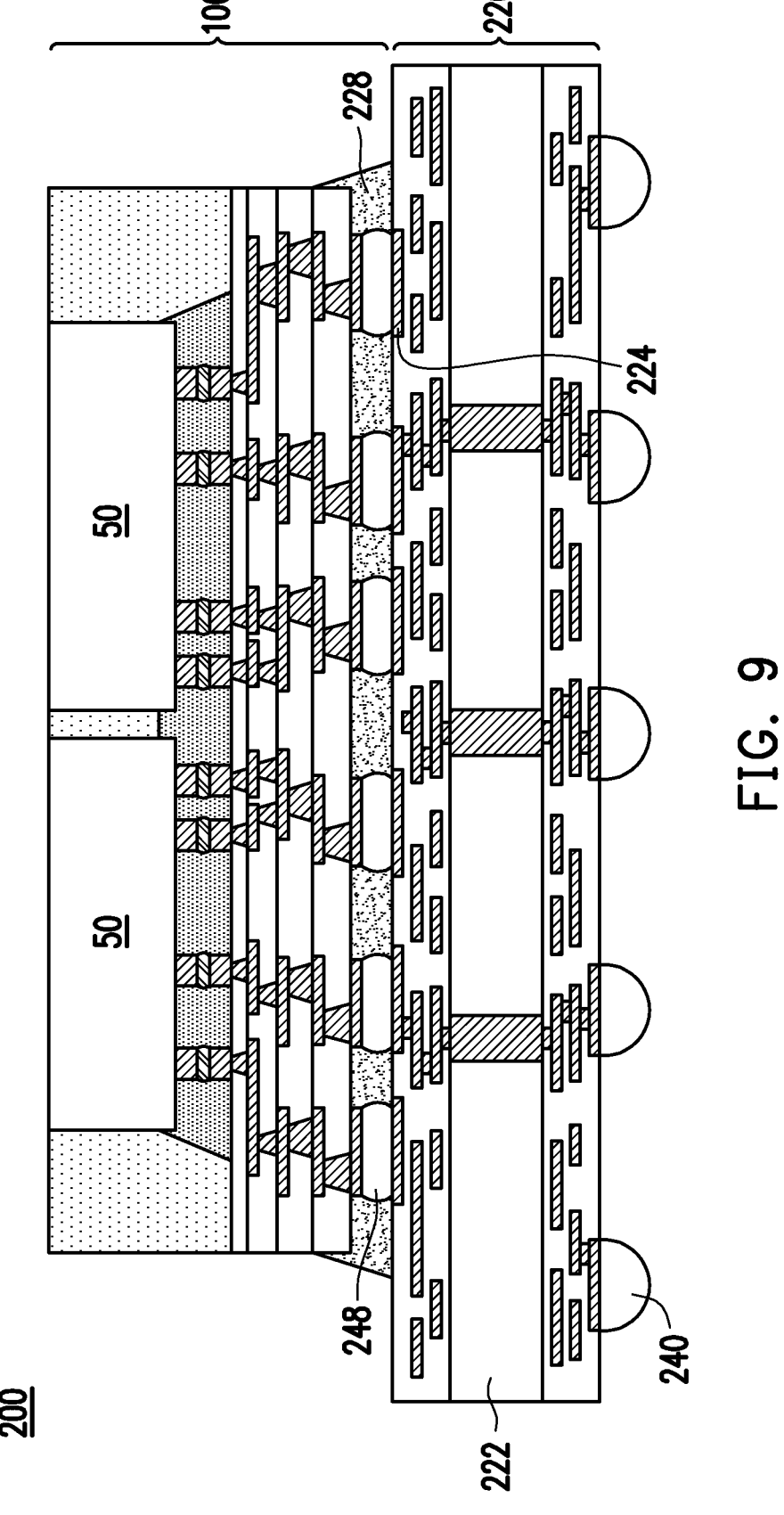

FIG. 9 illustrates the bonding of a package substrate 220 to the package component 100 to form the semiconductor package 200. In accordance with some embodiments, the package substrate 220 includes a substrate core 222, which may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 222 may be a SOI substrate. Generally, an SOI substrate includes a layer of a semiconductor material such as epitaxial silicon, germanium, silicon germanium, SOI, SGOI, or combinations thereof. In another embodiment, the substrate core 222 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate core 222.

The substrate core 222 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 222 may also include metallization layers and vias, and bond pads 224 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, or the like). In some embodiments, the substrate core 222 is substantially free of active and passive devices.

The conductive connectors 248 are reflowed to attach the conductive features 34U (e.g., UBMs) of the package component 100 to the bond pads 224 of the package substrate 220. The conductive connectors 248 connect the package component 100 to the package substrate 220 (e.g., metallization layers of the substrate core 222). Thus, the package substrate 220 is electrically connected to the integrated circuit devices 50. In some embodiments, passive devices (e.g., surface mount devices (SMDs), not specifically illustrated) may be attached to the package component 100 (e.g., bonded to the conductive features 34U) prior to mounting on the package substrate 220. In such embodiments, the passive devices may be bonded to a same surface of the package component 100 as the conductive connectors 248. In some embodiments (not specifically illustrated), passive devices (e.g., SMDs) may be attached to the package substrate 220, e.g., to the bond pads 224. For example, the passive devices may be attached to the package substrate 220 before or after attaching the package component 100 to the package substrate 220.

In some embodiments, an underfill 228 is formed between the package component 100 and the package substrate 220, surrounding the conductive connectors 248. The underfill 228 may be formed by a capillary flow process after the package component 100 is attached or may be formed by any suitable deposition method before the package component 100 is attached. The underfill 228 may be a continuous material extending from the package substrate 220 to the package component 100 (e.g., to some or all of the dielectric layers 32).

As further illustrated, the package substrate 220 may include external connectors 240 along a side opposite of attachment of the package components 100. The external connectors 240 may facilitate subsequent processing, such as testing (e.g., thermal cycle testing) and/or attachment and electrical connection of the package component 100 in an electronic device.

Advantages may be achieved. In particular, etch processes performed on a wafer 101 may utilize a treatment system having features designed to increase the uniformity of results across the wafer 101. For example, the diffusion plate 163 of the showerhead 161 may be designed with a particular layout of the holes 165 that distribute the etchants (e.g., treatment plasma 111) with greater flow in some regions (e.g., outer regions of the diffusion plate 163) and lesser flow in other regions (e.g., inner regions of the diffusion plate 163). As a result, a maximum-minimum range of the etch rates across the wafer 101 may be about 10% or less of an average etch-rate. In addition, a half-range of the etch rates may be achieved across about 95% or more of the wafer 101. The etch process and any other processes utilizing the disclosed embodiments may be performed with improved efficiency and with higher yield.

In an embodiment, a method includes: attaching a carrier to a semiconductor wafer using a release film; removing the carrier from the semiconductor wafer; and performing a treatment process to remove the release film from the semiconductor wafer, the treatment process comprising: flowing an etchant through a diffusion plate within a treatment chamber, the diffusion plate comprising concentric rings separated by dividers, the concentric rings comprising a first concentric ring of holes, a second concentric ring of holes, and a third concentric ring of holes, each of the concentric rings having a different hole density; and performing a cleaning process on the semiconductor wafer. In another embodiment, a first hole density of the first concentric ring of holes is less than a second hole density of the second concentric ring of holes, and wherein the second hole density of the second concentric ring of holes is less than a third hole density of the third concentric ring of holes. In another embodiment, a first pitch of the first concentric ring of holes is greater than a second pitch of the second concentric ring of holes, and wherein the second pitch of the second concentric ring of holes is greater than a third pitch of the third concentric ring of holes. In another embodiment, a first individual hole area of the first concentric ring of holes is less than a second individual hole area of the second concentric ring of holes, and wherein the second individual hole area of the second concentric ring of holes is less than a third individual hole area of the third concentric ring of holes. In another embodiment, the release film comprises a Light-to-Heat-Conversion material. In another embodiment, the dividers comprise a first divider disposed at a center of all of the concentric rings. In another embodiment, the dividers further comprise a second divider and a third divider, and wherein the second divider and the third divider have different widths. In another embodiment, flowing the etchant includes: etching the release film in a first region of the semiconductor wafer at a maximum etch rate; and etching the release film in a second region of the semiconductor wafer at a minimum etch rate, wherein a difference between the maximum etch rate and the minimum etch rate is less than or equal to 10% of an average etch rate of the release film across the semiconductor wafer. In another embodiment, the release film is in physical contact with a non-planar surface of the semiconductor wafer, and wherein the non-planar surface comprises a dielectric layer and an under-bump metallurgy embedded in the dielectric layer.

In an embodiment, a treatment system includes: a precursor delivery system; a precursor gas controller connected to the precursor delivery system by a gas line; a treatment chamber connected to the precursor gas controller by a manifold, the treatment chamber comprising: an inlet connected to the manifold; a showerhead comprising a diffusion plate, the diffusion plate comprising: a first concentric ring of holes around a first divider; and a second concentric ring of holes around a second divider; and a mounting platform below the diffusion plate. In another embodiment, the treatment system further includes a plasma block configured to convert a precursor material into a treatment plasma. In another embodiment, a first ratio of hole area to surface area of the first concentric ring of holes is less than a second ratio of hole area to surface area of the second concentric ring of holes. In another embodiment, a first pitch of the first concentric ring of holes is greater than a second pitch of the second concentric ring of holes. In another embodiment, a first individual hole area of the first concentric ring of holes is less than a second individual hole area of the second concentric ring of holes. In another embodiment, the showerhead further comprises a skirt ring, and wherein the diffusion plate and skirt ring have a closed-cell layout.

In an embodiment, a semiconductor treatment chamber includes: a housing; a mounting platform adjacent to a floor of the housing, the mounting platform configured to hold a semiconductor wafer; a showerhead above the mounting platform, the showerhead comprising: a skirt ring adjacent to a ceiling of the housing; and a diffusion plate extending across opposing sidewalls of the skirt ring, the diffusion plate comprising a plurality of holes, a first circle of the diffusion plate being bound by a first diameter, a second circle of the diffusion plate being bound by a second diameter greater than the first diameter, a first hole density of the first circle being less than a second hole density of the second circle having. In another embodiment, the diffusion plate comprises a plurality of dividers separating concentric rings of the plurality of holes. In another embodiment, the plurality of dividers comprises a circular divider located at a center of the diffusion plate. In another embodiment, a third hole density of the diffusion plate measured within a third circle having a third diameter is greater than the second hole density, the third diameter being greater than the second diameter. In another embodiment, the semiconductor treatment chamber further includes a radio frequency generator adjacent to the mounting platform.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
attaching a carrier to a wafer using a release film;
removing the carrier from the wafer; and
performing a treatment process to remove the release film from the wafer, wherein the release film is in physical contact with a non-planar surface of the wafer, and wherein the non-planar surface comprises a dielectric layer and a conductive feature embedded in the dielectric layer, the treatment process comprising:
flowing an etchant through a diffusion plate within a treatment chamber, the diffusion plate comprising concentric rings separated by dividers, the concentric rings comprising a first concentric ring of holes, a second concentric ring of holes, and a third concentric ring of holes, each of the concentric rings having a different hole density; and
performing a cleaning process on the wafer.

2. The method of claim 1, wherein a first hole density of the first concentric ring of holes is less than a second hole density of the second concentric ring of holes, and wherein the second hole density of the second concentric ring of holes is less than a third hole density of the third concentric ring of holes.

3. The method of claim 1, wherein a first pitch of the first concentric ring of holes is greater than a second pitch of the second concentric ring of holes, and wherein the second pitch of the second concentric ring of holes is greater than a third pitch of the third concentric ring of holes.

4. The method of claim 1, wherein a first individual hole area of the first concentric ring of holes is less than a second individual hole area of the second concentric ring of holes, and wherein the second individual hole area of the second concentric ring of holes is less than a third individual hole area of the third concentric ring of holes.

5. The method of claim 1, wherein the release film comprises a Light-to-Heat-Conversion material.

6. The method of claim 1, wherein the dividers comprise a first divider disposed at a center of all of the concentric rings.

7. The method of claim 6, wherein the dividers further comprise a second divider and a third divider, and wherein the second divider and the third divider have different widths.

8. The method of claim 1, wherein flowing the etchant comprises:

etching the release film in a first region of the wafer at a maximum etch rate; and etching the release film in a second region of the semiconductor wafer at a minimum etch rate, wherein a difference between the maximum etch rate and the minimum etch rate is less than or equal to 10% of an average etch rate of the release film across the wafer.

9. The method of claim 1, wherein the conductive feature comprises an under-bump metallurgy embedded in the dielectric layer.

10. A treatment system, comprising:

a precursor delivery system;

a precursor gas controller connected to the precursor delivery system by a gas line;

a treatment chamber connected to the precursor gas controller by a manifold, the treatment chamber comprising:

an inlet connected to the manifold;

a showerhead comprising a diffusion plate, the showerhead configured in the treatment chamber to flow process materials onto an underlying wafer, the underlying wafer comprising a center region, an intermediate region around the center region, and an outer region around the intermediate region, the showerhead further configured to flow the process materials onto the intermediate region at a faster rate than onto each of the center region and the outer region, the diffusion plate comprising:

a first concentric ring of holes around a first divider; and a second concentric ring of holes around a second divider; and a mounting platform below the diffusion plate.

11. The treatment system of claim 10, further comprising a plasma block configured to convert a precursor material into a treatment plasma.

12. The treatment system of claim 10, wherein a first ratio of hole area to surface area of the first concentric ring of holes is less than a second ratio of hole area to surface area of the second concentric ring of holes.

13. The treatment system of claim 10, wherein a first pitch of the first concentric ring of holes is greater than a second pitch of the second concentric ring of holes.

14. The treatment system of claim 10, wherein a first individual hole area of the first concentric ring of holes is less than a second individual hole area of the second concentric ring of holes.

15. The treatment system of claim 10, wherein the showerhead further comprises a skirt ring, and wherein the diffusion plate and skirt ring have a closed-cell layout.

16. A semiconductor treatment chamber, comprising:

a housing;

a mounting platform adjacent to a floor of the housing, the mounting platform configured to hold a semiconductor wafer;

a showerhead above the mounting platform, the showerhead comprising:

a skirt ring adjacent to a ceiling of the housing; and a diffusion plate extending across opposing sidewalls of the skirt ring, the diffusion plate comprising:

a first ring of holes being bound by a first diameter, the first ring of holes having a first hole pitch, a first hole area, and a first hole density;

a second ring of holes around the first ring and being bound by a second diameter greater than the first diameter, the second ring of holes having a second hole pitch, a second hole area, and a second hole density; and a third ring of holes around the second ring and being bound by a third diameter greater than the second diameter, the third ring of holes having a third hole pitch, a third hole area, and a third hole density, wherein the third hole pitch is greater than the second hole pitch.

17. The semiconductor treatment chamber of claim 16, wherein the diffusion plate comprises a plurality of dividers separating the first ring of holes, the second ring of holes, and the third ring of holes.

18. The semiconductor treatment chamber of claim 16, further comprising a radio frequency generator adjacent to the mounting platform.

19. The semiconductor treatment chamber of claim 16, wherein the second hole pitch is greater than the first hole pitch, wherein the third hole area is greater than the second hole area, and wherein the second hole area is greater than the first hole area.

20. The semiconductor treatment chamber of claim 19, wherein the first hole density, the second hole density, and the third hole density are substantially the same.

* * * * *